United States Patent
Oka et al.

(10) Patent No.: US 7,198,884 B2
(45) Date of Patent: Apr. 3, 2007

(54) HEAT STABLE PHOTOCURABLE RESIN COMPOSITION FOR DRY FILM RESIST

(75) Inventors: Hidetaka Oka, Takarazuka (JP); Masaki Ohwa, Kobe (JP); James Philip Taylor, Macclesfield (GB)

(73) Assignee: Ciba Specialty Chemicals Corp., Tarrytown, NY (US)

( * ) Notice: Subject to any disclaimer, the term of this patent is extended or adjusted under 35 U.S.C. 154(b) by 41 days.

(21) Appl. No.: 10/520,701

(22) PCT Filed: Jul. 1, 2003

(86) PCT No.: PCT/EP03/06954

§ 371 (c)(1),
(2), (4) Date: Jan. 6, 2005

(87) PCT Pub. No.: WO2004/008251

PCT Pub. Date: Jun. 22, 2005

(65) Prior Publication Data

US 2005/0260520 A1    Nov. 24, 2005

(30) Foreign Application Priority Data

Jul. 10, 2002    (EP) ................... 02405581

(51) Int. Cl.
G03C 1/805   (2006.01)
G03C 1/494   (2006.01)
G03C 1/492   (2006.01)
G03C 1/76    (2006.01)

(52) U.S. Cl. ............... 430/311; 430/258; 430/259; 430/260; 430/262; 430/263; 430/285.1; 430/287.1; 430/288.1; 430/910

(58) Field of Classification Search ........ 430/258–260, 430/262, 263, 285.1, 287.1, 288.1, 910, 311
See application file for complete search history.

(56) References Cited

U.S. PATENT DOCUMENTS

| 4,154,463 A | 5/1979 | Burri ............... 282/27.5 |
| 4,598,036 A | 7/1986 | Iwasaki et al. ...... 430/270 |
| 4,725,524 A | 2/1988 | Elzer et al. ........ 430/258 |

Primary Examiner—Geraldina Visconti
(74) Attorney, Agent, or Firm—Tyler A. Stevenson

(57) ABSTRACT

The invention relates to a process for preparing a dry film resist by forming a photocurable resin composition onto a support film with a thickness of 1 to 50 μm and optionally laminate a protective film onto the photocurable composition layer to obtain a dry film resist; whereby the photocurable resin is formed from a homogeneous mixture comprising (a) from 20–90 wt % of an alkaline soluble binder oligomer or polymer; (b) from 5 to 60 wt % of one or more photopolymerizable monomers which are compatible with the oligomers and polymers of component (a); (c) from 0.01 to 20% by weight of one or more photoinitiators; (d) from 0 to 20% by weight of additives and/or assistants; and (e) from 0.1 to 10% by weight of a leuco triphenylmethane dye of the formula (I), wherein $R^1$ is a residue selected from (II), $R^2$ is $C_1$–$C_{12}$ alkyl or phenyl which may be mono-, di- or tri-substituted by $C_1$–$C_6$ alkyl, trifluoromethyl, $C_{1-6}$ alkoxy, $C_{1-6}$ alkylthio, halogen and nitro; $R^3$ is hydrogen or $C_1$–$C_{12}$ alkyl; $R^4$ to $R^9$ independently of one another are hydrogen or $C_1$–$C_{12}$ alkyl; X is O, S, NH or N—$C_1$–$C_{12}$-alkyl; (a) to (e) being 100% by weight. The above composition is useful to avoid unfavourable colour generation during the heat lamination

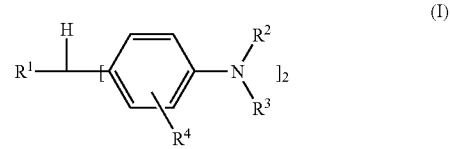

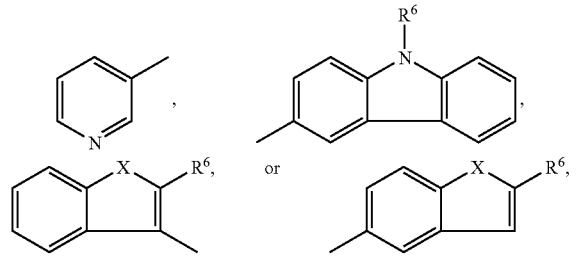

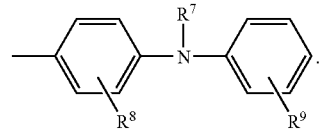

9 Claims, No Drawings

HEAT STABLE PHOTOCURABLE RESIN COMPOSITION FOR DRY FILM RESIST

The present invention relates to heat stable photocurable resin composition and to the use of this composition as a photosensitive layer for a dry film resist.

The so-called "dry film resists" are three-ply films which are produced by sandwiching a photocurable resin composition layer between a support film and a protective film. The photocurable resin composition is usually an alkali developing type. The unexposed portions are removed with an aqueous alkali solution upon development.

The photosensitive layer of dry film resists includes color formers that generate color after UV exposure and let the worker easily recognize if the resist is already exposed. Typically leuco crystal violet or leuco malachite green has been used as the color former for a dry film resist. Because their thermal stability is not sufficient, color is generated while thermally laminating the photocurable resin composition onto a substrate. This undesired color generation during the lamination process reduces the color contrast between exposed and unexposed area.

Thus, it is an object of the invention to reduce the undesired color generation during heat lamination process and get a clear color contrast between exposed and unexposed area.

It has now been found that the unfavourable color generation during the heat lamination process is minimized when using a leuco dye as described below.

Thus, the invention relates to a process for preparing a dry film resist by forming a photocurable resin composition onto a support film with a thickness of 1 to 50 μm and optionally laminate a protective film onto the photocurable composition layer to obtain a dry film resist; whereby the photocurable resin is formed from a homogeneous mixture comprising (a) from 20–90 wt % of an alkaline soluble binder oligomer or polymer;
(b) from 5 to 60 wt % of one or more photopolymerizable monomers which are compatible with the oligomers and polymers of component (a);
(c) from 0.01 to 20% by weight of one or more photoinitiators;
(d) from 0 to 20% by weight of additives and/or assistants; and
(e) from 0.1 to 10% by weight of a leuco triphenylmethane dye of the formula I

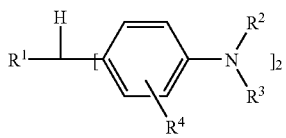

wherein
$R^1$ is a residue selected from

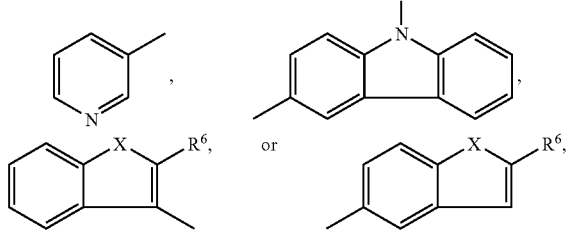

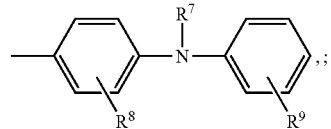

$R^2$ is $C_1$–$C_{12}$ alkyl or phenyl which may be mono-, di- or tri-substituted by $C_1$–$C_6$ alkyl, trifluoromethyl, $C_{1-6}$ alkoxy, $C_{1-6}$ alkylthio, halogen and nitro;
$R^3$ is hydrogen or $C_1$–$C_{12}$ alkyl;
$R^4$ to $R^9$ independently of one another are hydrogen or $C_1$–$C_{12}$ alkyl;
X is O, S, NH or N—$C_1$–$C_{12}$-alkyl;
(a) to (e) being 100% by weight.

Preferred are leuco triphenylmethane dyes of the formula I, wherein
$R^1$ is a residue selected from

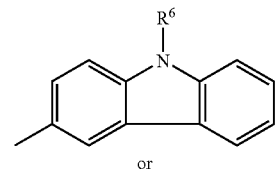

or

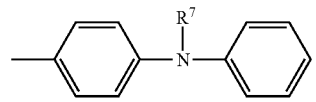

$R^2$ is unsubstituted phenyl,
$R^3$ is $C_1$–$C_4$alkyl
$R^4$ is hydrogen;
$R^5$ and $R^7$ are $C_1$–$C_4$alkyl.

Especially preferred is 4,4'-[(9-Butyl-9H-carbazol-3-yl)methylene]bis[N-methyl-N-phenyl-aniline] as a color former (Pergascript Blue S-RBP from Ciba Specialty Chemicals).

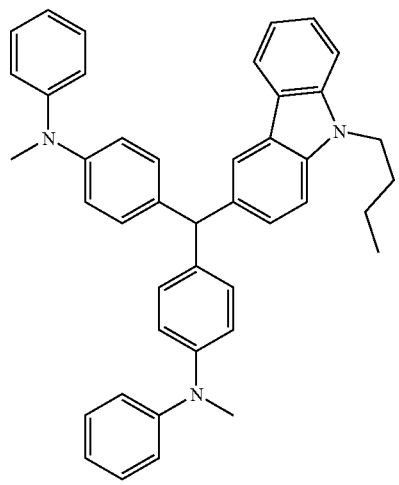

Preferred is the lamination of a protective film onto the photocurable composition layer.

Definitions:

In the definitions of the respective groups in the general formula (I), the $C_1$–$C_{12}$alkyl and the alkyl moiety in the $C_1$–$C_6$ alkoxy or alkylthio means a straight or branched alkyl having 1 to 12 carbon atoms, for example, methyl, ethyl, propyl, isopropyl, butyl, isobutyl, sec-butyl, tert-butyl, pentyl, neopentyl, hexyl, etc.

Component (a) is an Alkaline Soluble Binder Polymer.

The suitable binders are polymers having a molecular weight of about 2'000 to 2'000'000, preferably 10,000 to 500'000, and acid value from 50 to 600 mgKOH/g, preferably 100 to 300 mgKOH/g. Examples of alkali developable binders are acrylic polymer having carboxylic acid function as a pendant group, such as conventionally known copolymers obtained by copolymerizing an ethylenic unsaturated carboxylic acid such as (meth)acrylic acid, 2-carboxyethyl (meth)acrylic acid, 2-carboxypropyl (meth)acrylic acid itaconic acid, crotonic acid, maleic acid, half-ester of maleic acid and fumaric acid, with one or more monomers selected from esters of (meth)-acrylic acid, such as methyl (meth) acrylate, ethyl (meth)acrylate, propyl (meth)-acrylate, butyl (meth)acrylate, benzyl (meth)acrylate, 2-ethylhexyl (meth) acrylate, hydroxyethyl (meth) $C_1$–$C_4$alkyl acrylate, hydroxypropyl (meth)acrylate; vinyl aromatic compounds, such as styrene, α-methylstyrene, vinyltoluene, p-chlorostyrene; amide type unsaturated compounds, (meth)acrylamide diacetone acrylamide, N-methylolacrylamide, N-butoxymethacrylamide; and polyolefin type compounds, such as butadiene, isoprene, chloroprene and the like; methacrylonitrile, methyl isopropenyl ketone, vinyl acetate, vinyl propionate, or vinyl pivalate. Examples of copolymers are copolymers of acrylates and methacrylates with acrylic acid or methacrylic acid and with styrene or substituted styrene, phenolic resins, for example novolak, (poly)hydroxystyrene, and copolymers of hydroxystyrene with alkyl acrylates, acrylic acid and/or methacrylic acid. Preferable examples of copolymers are copolymers of methyl methacrylate/methacrylic acid, copolymers of benzyl methacrylate/methacrylic acid, copolymers of methyl methacrylate/ethyl acrylate/methacrylic acid, copolymers of benzyl methacrylate/methacrylic acid/styrene, copolymers of benzyl methacrylate/methacrylic acid/hydroxyethyl methacrylate, copolymers of methyl methacrylate/butyl methacrylate/methacrylic acid/styrene, copolymers of methyl methacrylate/benzyl methacrylate/methacrylic acid/hydroxyphenyl methacrylate. The polyimide binder resin in the present invention can be a polyimide precursor, for example, a poly(amic acid).

Other examples of component (a) are polymers or oligomers having at least two ethylenically unsaturated groups and at least one carboxyl function within the molecule structure, such as a resin obtained by the reaction of a saturated or unsaturated polybasic acid anhydride with a product of the reaction of an epoxy compound and an unsaturated monocarboxylic acid (for example, EB9696 from UCB Chemicals; KAYARAD TCR1025 from Nippon Kayaku Co. LTD.; NK OLI GO EA-6340, EA-7440 from Shin-Nakamura Chemical Co., Ltd.), or an addition product formed between a carboxyl group-containing resin and an unsaturated compound having an α,β-unsaturated double bond and an epoxy group (for ex., ACA200, ACA200M, ACA210P, ACA230AA, ACA250, ACA300, ACA320 from Daicel Chemical Industries, Ltd.).

Examples of component (b) which are suitable in the compositions according to the invention are photopolymerizable vinyl type monomers. The representative examples are hydroxyalkyl acrylates such as 2-hydroxyethyl acrylate, 2-hydroxybutyl acrylate, etc.; mono- or diacrylates of glycols such as ethylene glycol, methoxytetraethylene glycol, polyethylene glycol, propylene glycol, etc.; acrylamides such as N,N-dimethylacrylamide, N-methylolacrylamide, etc.; aminoalkyl acrylates such as N,N-dimethylaminoethyl acrylate, etc.; polyvalent acrylates of polyvalent alcohols such as hexanediol, trimethylolpropane, pentaerythritol, dipentaerythritol, and ethylene oxide or propylene oxide adducts thereof, tris-hydroxyethyl isocyanurate, etc.; phenoxy acrylate, bisphenol A diacrylate and acrylates of ethylene oxide or propylene oxide adducts of these phenols, etc.; acrylates of glycidyl ethers such as glycerin diglycidyl ether, trimethylolpropane triglycidyl ether, triglycidyl isocyanurate, etc.; and melamine acrylate, and/or methacrylates corresponding to the above acrylates, etc.

A mono- or multi-functional ethylenically unsaturated compound, or mixtures of several of said compounds, can be included in the above composition up to 60% by weight based on the solid portion of the composition.

The unsaturated compounds (b) can also be used as a mixture with non-photopolymerizable, film-forming components. These may, for example, be physically drying polymers or solutions thereof in organic solvents, for instance nitrocellulose or cellulose acetobutyrate. They may also, however, be chemically and/or thermally curable (heat-curable) resins, examples being polyisocyanates, polyepoxides and melamine resins, as well as polyimide precursors. The use of heat-curable resins at the same time is important for use in systems known as hybrid systems, which in a first stage are photopolymerized and in a second stage are crosslinked by means of thermal after treatment.

Any compound so far known as a photoinitiator can be used as a component (c). The examples of component (c) are camphor quinone, benzophenone, benzophenone derivatives, acetophenone, acetophenone derivatives, for example α-hydroxycycloalkyl phenyl ketones or 2-hydroxy-2-methyl-1-phenyl-propanone, dialkoxyacetophenones, α-hydroxy- or α-aminoacetophenones, e.g. (4-methylthiobenzoyl)-1-methyl-1-morpholinoethane, (4-morpholinobenzoyl)-1-benzyl-1-dimethylaminopropane, 4-aroyl-1,3-dioxolanes, benzoin alkyl ethers and benzil ketals, e.g. dimethyl benzil ketal, phenylglyoxalic esters and derivatives thereof, dimeric phenylglyoxalic esters, diacetyl, peresters, e.g. benzophenone tetracarboxylic peresters as described for example in EP 126541, monoacyl phosphine oxides, e.g. (2,4,6-trimethylbenzoyl)diphenylphosphine oxide, bisacylphosphine oxides, bis(2,6-dimethoxy-benzoyl)-(2,4,4-trimethyl-pentyl)phosphine oxide, bis(2,4,6-trimethylbenzoyl)-phenylphosphine oxide, bis(2,4,6-trimethylbenzoyl)-2,4-dipentoxyphenylphosphine oxide, trisacylphosphine oxides, oxime esters, for example 1-phenyl-1,2-propanedione-2-(o-benzoyl)oxime, 1-phenyl-1,2-propanedione-2-(o-ethoxycarbonyl)oxime or other oxime esters described in GB2339571A and U.S. 2001/0012596A1, halomethyltriazines, e.g. 2-[2-(4-methoxy-phenyl)-vinyl]-4,6-bis-trichloromethyl-[1,3,5]triazine, 2-(4-methoxy-phenyl)-4,6-bis-trichloromethyl-[1,3,5]triazine, 2-(3,4-dimethoxy-phenyl)-4,6-bis-trichloromethyl-[1,3,5] triazine, 2-methyl-4,6-bis-trichloromethyl-[1,3,5]triazine, 2-(4-N,N-di(ethoxycarbonylmethyl)-aminophenyl)-4,6-bis (trichloromethyl)-[1,3,5]triazine, 2-(4-methoxy-naphthyl)-4,6-bis-trichloromethyl-[1,3,5]triazine, 2-(1,3-benzodioxol-5-yl)-4,6-bis-trichloromethyl-[1,3,5]triazine, 2-[2-[4-(pentyloxy)phenyl]ethenyl]-4,6-bis-trichloromethyl-[1,3,5] triazine, 2-[2-(3-methyl-2-furanyl)-ethenyl]-4,6-bis-trichloromethyl-[1,3,5]triazine, 2-[2-(5-methyl-2-furanyl)-ethenyl]-4,6-bis-trichloromethyl-[1,3,5]triazine, 2-[2-(2,4-dimethoxy-phenyl)-ethenyl]-4,6-bis-trichloromethyl[1,3,5] triazine, 2-[2-(2-methoxy-phenyl)ethenyl]-4,6-bis-trichloromethyl-[1,3,5]triazine, 2-[2-[4-isopropyloxy-phenyl]-ethenyl]-4,6-bis-trichloromethyl-[1,3,5]triazine, 2-[2-(3-chloro-4-methoxy-phenyl)ethenyl]-4,6-bis-trichloromethyl-[1,3,5]triazine, 2-[2-bromo-4-N,N-di(ethoxycarbonylmethyl)amino-phenyl]-4,6-bis-trichloromethyl-[1,3,5]triazine, 2-[2-chloro-4-N,N-di(ethoxycarbonylmethyl)amino-phenyl]-4,6-bis-trichloromethyl-[1,3,5]triazine, 2-[3-bromo-4-N,N-di(ethoxycarbonylmethyl)amino-phenyl]-4,6-bis-trichloromethyl-[1,3,5]triazine, 2-[3-chloro-4-N,N-di(ethoxycarbonylmethyl)amino-phenyl]-4,6-bis-trichloromethyl-[1,3,5]triazine, or other halomethyl-triazines as described for example in G. Buhr, R. Dammel and C. Lindley Polym. Mater. Sci. Eng. 61, 269 (1989), and EP 0262788; halomethyl-oxazol photoinitiators, such as described in U.S. Pat. No. 4,371,606 and U.S. Pat. No. 4,371,607; 1,2-disulfones, such as described in E. A. Bartmann, Synthesis 5, 490 (1993); hexaarylbisimidazole, and hexaarylbisimidazole/coinitiators systems, e.g. ortho-chlorohexaphenyl-bisimidazole combined with 2-mercaptobenzthiazole, ferrocenium compounds, or titanocenes, e.g. bis(cyclopentadienyl)-bis(2,6-difluoro-3-pyrryl-phenyl)titanium, bisacridine derivatives like 1,7-bis(9-acridinyl)heptane. One of the mentioned photoinitiators, or mixtures of several said compounds, can be included in the above composition up to 20% by weight based on the solid portion of the composition.

Further additives (d) which may be included. To promote the color formation of the triphenylmethane dye e) it is possible to add halogenated compounds, triazines,-bisimidazoles or onium salt type photo acid generators as an example of component d). The examples of the halogenated compounds are amyl bromide, isoamyl bromide, isobutyl bromide, ethyl bromide, diphenylmethyl bromide, benzoyl bromide, methylene bromide, tribromomethylphenylsulfone, tribromophenylsulfone, carbon tetrabromide, tris(2,3-dibromopropyl)phosphate, pentabromoethane, trichloroacetamide, amyl iodide, isobutyl iodide, 1,1,1-trichloro-2,2-bis(p-chlorophenyl)ethane and hexachloroethane. The examples of onium salt type photo acid generators are bisaryl iodonium compounds and triaryl sulfonium compounds. Suitable diaryliodonium salts are described in U.S. Pat. No. 6,306,555. U.S. Pat. No. 6,306,555 describes diaryliodonium salts of formula

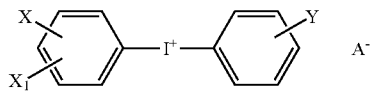

wherein
X is branched $C_3$–$C_{20}$alkyl or $C_3$–$C_8$cycloalkyl;
$X_1$ is hydrogen, linear $C_1$–$C_{20}$alkyl, branched $C_3$–$C_{20}$alkyl or $C_3$–$C_8$cycloalkyl; with the proviso that the sum of the carbon atoms in X and $X_1$ is at least 4;
Y is linear $C_1$–$C_{10}$alkyl, branched $C_3$–$C_{10}$alkyl or $C_3$–$C_8$cycloalkyl;
$A^-$ is a non-nucleophilic anion, selected from the group $(BF_4)^-$, $(SbF_6)^-$, $(PF_6)^-$, $(B(C_6F_5))_4^-$, $C_1$–$C_{20}$alkylsulfonate, $C_2$–$C_{20}$haloalkylsulfonate, unsubstituted $C_6$–$C_{10}$arylsulfonate, camphorsulfonate, $C_1$–$C_{20}$-perfluoroalkylsulfonylmethide, $C_1$–$C_{20}$-perfluoroalkylsulfonylimide, and $C_6$–$C_{10}$arylsulfonate substituted by halogen, $NO_2$, $C_1$–$C_{12}$alkyl, $C_1$–$C_{12}$halo-alkyl, $C_1$–$C_{12}$alkoxy or by $COOR_1$; and
$R_1$ is $C_1$–$C_{20}$alkyl, phenyl, benzyl; or phenyl mono- or poly-substituted by $C_1$–$C_{12}$alkyl, $C_1$–$C_{12}$alkoxy or by halogen.

The commercially available bisaryl iodonium salts are Irgacure 250 (iodonium, (4-methylphenyl)[4-(2-methylpropyl)phenyl]-, hexafluorophosphate(1−) from Ciba Specialty Chemicals), CD 1012 (Sartomer), UV 9380C (GE Bayer Silicones), Rhodorsil 2074 (Rhodia) etc., and triaryl sulfonium salts are UVI-6990, UVI-6974 (Union Carbide) etc.

It is possible to add photosensitizers or coinitiators to accelerate the photo curing speed as an example of component (d) which shift or broaden the spectral sensitivity. These are, in particular, aromatic compounds, for example benzophenone and derivatives thereof, thioxanthone and derivatives thereof, anthraquinone and derivatives thereof, coumarin and phenothiazine and derivatives thereof, and also 3-(aroylmethylene)thiazolines, rhodanine, camphorquinone, but also eosine, rhodamine, erythrosine, xanthene, thioxanthene, acridine, e.g. 9-phenylacridine, 1,7-bis(9-acridinyl)heptane, 1,5-bis(9-acridinyl)pentane, cyanine and merocyanine dyes.

Specific examples of such compounds are

1. Thioxanthones

Thioxanthone, 2-isopropylthioxanthone, 2-chlorothioxanthone, 1-chloro-4-propoxythioxanthone, 2-dodecylthioxanthone, 2,4-diethylthioxanthone, 2,4-dimethylthioxanthone, 1-methoxycarbonylthioxanthone, 2-ethoxycarbonylthioxanthone, 3-(2-methoxyethoxycarbonyl)-thioxanthone, 4butoxycarbonylthioxanthone, 3-butoxycarbonyl-7-methylthioxanthone, 1-cyano-3-chlorothioxanthone, 1-ethoxycarbonyl-3-chlorothioxanthone, 1-ethoxycarbonyl-3-ethoxythioxanthone, 1-ethoxycarbonyl-3-aminothioxanthone, 1-ethoxycarbonyl-3-phenylsulfurylthioxanthone, 3,4-di-[2-(2-methoxyethoxy)ethoxycarbonyl]-thioxanthone, 1,3-dimethyl-2-hydroxy-9H-thioxanthen-9-one 2-ethylhexylether, 1-ethoxycarbonyl-3-(1-methyl-1-morpholinoethyl)-thioxanthone, 2-methyl-6-dimethoxymethyl-thioxanthone, 2-methyl-6-(1,1-dimethoxybenzyl)-thioxanthone, 2-morpholinomethylthioxanthone, 2-methyl-6-morpholinomethylthioxanthone, N-allylthioxanthone-3,4-dicarboximide, N-octylthioxanthone-3,4-dicarboximide, N-(1,1,3,3-tetramethylbutyl)-thioxanthone-3,4-dicarboximide, 1-phenoxythioxanthone, 6-ethoxycarbonyl-2-methoxythioxanthone, 6-ethoxycarbonyl-2-methylthioxanthone, thioxanthone-2-carboxylic acid polyethyleneglycol ester, 2-hydroxy-3-(3,4-dimethyl-9-oxo-9H-thioxanthon-2-yloxy)-N,N,N-trimethyl-1-propanaminium chloride;

2. Benzophenones benzophenone, 4-phenyl benzophenone, 4-methoxy benzophenone, 4,4'-dimethoxy benzophenone, 4,4'-dimethyl benzophenone, 4,4'-dichlorobenzophenone 4,4'-bis(dimethylamino)benzophenone, 4,4'-bis(diethylamino)benzophenone, 4,4'-bis(methylethylamino)benzophenone, 4,4'-bis(p-isopropylphenoxy)benzophenone, 4-methyl benzophenone, 2,4,6-trimethylbenzophenone, 4-(4-methylthiophenyl)-benzophenone, 3,3'-dimethyl-4-methoxy benzophenone, methyl-2-benzoylbenzoate, 4-(2-hydroxyethylthio)-benzophenone, 4-(4-tolylthio)benzophenone, 1-[4-(4-benzoy-phenylsulfanyl)-phenyl]-2-methyl-2-(toluene-4-sulfonyl)-propan-1-one, 4-benzoyl-N,N,N-trimethylbenzenemethanaminium chloride, 2-hydroxy-3-(4-benzoylphenoxy)-N,N,N-trimethyl-1-propanaminium chloride monohydrate, 4-(13-acryloyl-1,4,7,10,13-pentaoxatridecyl)-benzophenone, 4-benzoyl-N,N-dimethyl-N-[2-(1-oxo-2-propenyl)oxy]ethyl-benzenemethanaminium chloride;

3. Coumarins

Coumarin 1, Coumarin 2, Coumarin 6, Coumarin 7, Coumarin 30, Coumarin 102, Coumarin 106, Coumarin 138, Coumarin 152, Coumarin 153, Coumarin 307, Coumarin 314, Coumarin 314T, Coumarin 334, Coumarin 337, Coumarin 500,3-benzoyl coumarin, 3-benzoyl-7-methoxycoumarin, 3-benzoyl-5,7-dimethoxycoumarin, 3-benzoyl-5,7-dipropoxycoumarin, 3-benzoyl-6,8-dichlorocoumarin, 3-benzoyl-6-chloro-coumarin, 3,3'-carbonyl-bis[5,7-di(propoxy)coumarin], 3,3'-carbonyl-bis(7-methoxycoumarin), 3,3'-carbonyl-bis(7-diethylamino-coumarin), 3-isobutyroyl-coumarin, 3-benzoyl-5,7-dimethoxy-coumarin, 3-benzoyl-5,7-diethoxy-coumarin, 3-benzoyl-5,7-dibutoxycoumarin, 3-benzoyl-5,7-di(methoxyethoxy)-coumarin, 3-benzoyl-5,7-di(allyloxy)coumarin, 3-benzoyl-7-dimethylaminocoumarin, 3-benzoyl-7-diethylaminocoumarin, 3-isobutyroyl-7-dimethylaminocoumarin, 5,7-dimethoxy-3-(1-naphthoyl)-coumarin, 5,7-diethoxy-3-(1-naphthoyl)-coumarin, 3-benzoylbenzo[f]coumarin, 7-diethylamino-3-thienoylcoumarin, 3-(4-cyanobenzoyl)-5,7-dimethoxycoumarin, 3-(4-cyanobenzoyl)-5,7-dipropoxycoumarin, 7-dimethylamino-3-phenylcoumarin, 7-diethylamino-3-phenylcoumarin, the coumarin derivatives disclosed in JP 09-179299-A and JP 09-325209-A, for example 7-[{4-chloro-6-(diethylamino)-S-triazine-2-yl}amino]-3-phenylcoumarin;

4. 3-(aroylmethylene)-thiazolines 3-methyl-2-benzoylmethylene-□-naphthothiazoline, 3-methyl-2-benzoylmethylene-benzothiazoline, 3-ethyl-2-propionylmethylene-□-naphthothiazoline;

5. Rhodanines 4-dimethylaminobenzalrhodanine, 4-diethylaminobenzalrhodanine, 3-ethyl-5-(3-octyl-2-benzothiazolinylidene)-rhodanine, the rhodanine derivatives, formulae [1], [2], [7], disclosed in JP 08-305019A;

6. Other Compounds acetophenone, 3-methoxyacetophenone, 4-phenylacetophenone, benzil, 4,4'-bis(dimethylamino)benzil, 2-acetylnaphthalene, 2-naphthaldehyde, dansyl acid derivatives, 9,10-anthraquinone, anthracene, pyrene, aminopyrene, perylene, phenanthrene, phenanthrenequinone, 9-fluorenone, dibenzosuberone, curcumin, xanthone, thiomichler's ketone, α-(4-dimethylaminobenzylidene) ketones, e.g. 2,5-bis(4-diethylaminobenzylidene)cyclopentanone, 2-(4-dimethylamino-benzylidene)-indan-1-one, 3-(4-dimethylamino-phenyl)-1-indan-5-yl-propenone, 3-phenylthiophthalimide, N-methyl-3,5-di(ethylthio)-phthalimide, N-methyl-3,5-di(ethylthio)phthalimide, phenothiazine, methylphenothiazine, amines, e.g. N-phenylglycine, ethyl 4-dimethylaminobenzoate, butoxyethyl 4-dimethylaminobenzoate, 4-dimethylaminoacetophenone, triethanolamine, methyldiethanolamine, dimethylaminoethanol, 2-(dimethylamino)ethyl benzoate, poly(propylenegylcol)-4-(dimethylamino) benzoate.

A photopolymerizable composition, comprising as further additive (d) a photosensitizer compound selected from the group consisting of benzophenone and its derivatives, thioxanthone and its derivatives, anthraquinone and its derivatives, or coumarin derivatives is preferred.

The curing process can be assisted by adding photosensitizers, in particular, in compositions which are pigmented (for example with titanium dioxide), and also by adding a component which under thermal conditions forms free radicals, for example an azo compound such as 2,2'-azobis(4-methoxy-2,4-dimethylvaleronitrile), a triazene, diazo sulfide, pentazadiene or a peroxy compound, for instance a hydroperoxide or peroxycarbonate, for example t-butyl hydroperoxide, as described for example in EP 245639.

Other examples of component d) are colorants like pigments or dyes, which are inert towards the other components of the photoresist formulations and does not interfere with the photo polymerization process. Example of such pigments and dyes include but not limited to phthalocyanines, Brilliant Green Dye, Malachite Green, fuchsine, auramine, Crystal Violet, Victoria Blue, substituted naphthalimide dyes, such as Calcofluor Yellow HEB, rhodamines and azosols.

In addition, the photopolymerizable mixtures may include various additives (d). Examples of these are thermal inhibitors, which are intended to prevent premature polymerization, examples being hydroquinone, hydroquinone derivatives, p-methoxyphenol, β-naphthol or sterically hindered phenols, such as 2,6-di-tert-butyl-p-cresol In order to increase the stability on storage in the dark it is possible, for example, to use copper compounds, such as copper naphthenate, stearate or octoate, phosphorus compounds, for example triphenylphosphine, tributylphosphine, triethyl phosphite, triphenyl phosphite or tribenzyl phosphite, quaternary ammonium compounds, for example tetramethylammonium chloride or trimethylbenzylammonium chloride, or hydroxylamine derivatives, for example N-diethylhydroxylamine. To exclude atmospheric oxygen during the polymerization it is possible to add paraffin or similar wax-like substances which, being of inadequate solubility in the polymer, migrate to the surface in the beginning of polymerization and form a transparent surface layer which prevents the ingress of air. It is also possible to apply an oxygen-impermeable layer on top of the coating, for example poly(vinylalcohol-co-vinylacetate). Light stabilizers which can be added in a small quantity are UV absorbers, for example those of the hydroxyphenylbenzotriazole, hydroxyphenyl-benzophenone, oxalamide or hydroxyphenyl-s-triazine type. These compounds can be used individually or in mixtures, with or without sterically hindered amines (HALS).

Examples of such UV absorbers and light stabilizers are
1. 2-(2'-hydroxyphenyl)benzotriazoles for example 2-(2'-hydroxy-5'-methylphenyl)benzotriazole, 2-(3',5'-di-tert-butyl-2'-hydroxyphenyl)benzotriazole, 2-(5'-tert-butyl-2'-hydroxyphenyl)benzotriazole, 2-(2'-hydroxy-5'-(1,1,3,3-tetramethylbutyl)phenyl)benzotriazole, 2-(3',5'-di-tert-butyl-2'-hydroxyphenyl)-5-chlorobenzotriazole, 2-(3'-tert-butyl-2'-hydroxy-5'-methylphenyl)-5-chlorobenzotriazole, 2-(3'-sec-butyl-5'-tert-butyl-2'-hydroxyphenyl)benzotrizole, 2-(2'-hydroxy-4'-octoxyphenyl)benzotriazole, 2-(3',5'-di-tert-amyl-2'-hydroxyphenyl)benzotriazole, 2-(3',5'-bis-(α, α-dimethylbenzyl)-2'-hydroxyphenyl)-benzotriazole, mixture of 2-(3'-tert-butyl-2'hydroxy-5'-(2-octyloxycarbonylethyl)phenyl)-5-chlorobenzotriazole, 2-(3'-tert-butyl-5'-[2-(2-ethyl-hexyl-oxy)carbonylethyl]-2'-hydroxyphenyl)-5-chlorobenzotriazole, 2-(3'-tert-butyl-2'-hydroxy-5'-(2-methoxycarbonylethyl)phenyl)-5-chlorobenzotriazole, 2-(3'-tert-butyl-2'-hydroxy-5'-(2-methoxycarbonylethyl)phenyl)-benzotriazole, 2-(3'-tert-butyl-2'-hydroxy-5'-(2-octyloxycarbonylethyl)phenyl) benzotriazole, 2-(3'-tert-butyl-5'-[2-(2-ethylhexyloxy) carbonylethyl]-2'-hydroxyphenyl)benzotriazole, 2-(3'-dodecyl-2'-hydroxy-5'-methylphenyl)benzotriazole, and 2-(3'-tert-butyl-2'-hydroxy-5'-(2-isooctyloxycarbonylethyl) phenylbenzotriazole, 2,2'-methylene-bis[4-(1,1,3,3-tetramethylbutyl)-6-benzotriazol-2-yl-phenol]; transesterification product of 2-[3'-tert-butyl-5'-(2-methoxycarbonylethyl)-2'-hydroxy-phenyl]-benzotriazole with polyethylene glycol 300; [R—CH$_2$CH$_2$—COO(CH$_2$)$_3$]$_2$— where R=3'-tert-butyl-4'-hydroxy-5'-2H-benzotriazol-2-yl-phenyl.

2. 2-Hydroxybenzophenones, for example the 4-hydroxy 4-methoxy-, 4-octoxy-, 4-decyloxy-, 4-dodecyloxy-, 4-benzyloxy-, 4,2',4'-trihydroxy- and 2'-hydroxy-4,4'-dimethoxy derivative.

3. Esters of substituted or unsubstituted benzoicacids, for example 4-tert-butylphenyl salicylate, phenyl salicylate, octylphenyl salicylate, dibenzoylresorcinol, bis(4-tert-butylbenzoyl)resorcinol, benzoylresorcinol, 2,4-di-tert-butylphenyl 3,5-di-tert-butyl-4-hydroxybenzoate, hexadecyl 3,5-di-tert-butyl-4-hydroxybenzoate, octadecyl 3,5-di-tert-butyl-4-hydroxybenzoate, and 2-methyl-4,6-di-tert-butylphenyl 3,5-di-tert-butyl-4-hydroxybenzoate.

4. Acrylates, for example isooctyl or ethyl α-cyano-β,β-diphenyl acrylate, methyl α-carbomethoxycinnamate, butyl or methyl α-cyano-β-methyl-p-methoxycinnamate, methyl α-carboxymethoxy-p-methoxycinnamate and N-(β-carbomethoxy-β-cyanovinyl)-2-methylindoline.

5. Sterically hindered amines, for example bis-(2,2,6,6-tetramethylpiperidyl) sebacate, bis-(2,2,6,6-tetramethylpiperidyl) succinate, bis-(1,2,2,6,6-pentamethylpiperidyl) sebacate, bis-(1,2,2,6,6-pentamethylpiperidyl) n-butyl-3,5-di-tert-butyl-4-hydroxybenzylmalonate, condensation product of 1-hydroxyethyl-2,2,6,6-tetramethyl-4-hydroxypiperidine and succinic acid, condensation product of N,N'-bis-(2,2,6,6-tetramethyl-4-piperidyl)hexa-methylenediamine and 4-tert-octylamino-2,6-dichloro-1,3,5-s-triazine, tris-(2,2,6,6-tetramethyl-4-piperidyl) nitrilotriacetate, tetrakis-(2,2,6,6-tetramethyl-4-piperidyl)-1,2,3,4-butane tetraoate, 1,1'-(1,2-ethandiyl)bis(3,3,5,5-tetramethyl-piperazinone), 4-benzoyl-2,2,6,6-tetramethylpiperidine, 4-stearyloxy-2,2,6,6-tetramethylpiperidine, bis-(1,2,2,6,6-pentamethylpiperidyl) 2-n-butyl-2-(2-hydroxy-3,5-di-tert-butylbenzyl) malonate, 3-n-octyl-7,7,9,9-tetramethyl-1,3,8-triazaspiro-[4.5]decane-2,4-dione, bis-(1-octyloxy-2,2,6,6-tetramethylpiperidyl) sebacate, bis-(1-octyloxy-2,2,6,6-tetramethylpiperidyl) succinate, condensation product of N,N'-bis-(2,2,6,6-tetramethyl-4-piperidyl)hexamethylenediamine and 4-morpholino-2,6-dichloro-1,3,5-triazine, condensation product of 2-chloro-4,6-di-(4-n-butylamino-2,2,6,6-tetramethylpiperidyl)-1,3,5-triazine and 1,2-bis-(3-aminopropyl-amino) ethane, condensation product of 2-chloro-4,6-di-(4-n-butylamino-1,2,2,6,6-pentamethylpiperidyl)-1,3,5-triazine and 1,2-bis-(3-aminopropylamino)ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl)pyrrolidine-2,5-dione and 3-dodecyl-1-(1,2,2,6,6-penta-methyl-4-piperidyl)-pyrrolidine-2,5-dione.

6. Oxalamides, for example 4,4'-dioctyloxyoxanilide, 2,2'-diethoxyoxanilide, 2,2'-dioctyloxy-5,5'-di-tert-butyloxanilide, 2,2'-didodecyloxy-5,5'di-tert-butyloxanilide, 2-ethoxy-2'-ethyl-oxanilide, N,N'-bis-(3-dimethylaminopropyl)oxalamide, 2-ethoxy-5-tert-butyl-2'-ethyloxanilide and its mixture with 2-ethoxy-2'-ethyl-5,4'-di-tert-butyloxanilide, mixtures of o- and p-methoxy- and of o- and p-ethoxy-disubstituted oxanilides.

7. 2-(2-Hydroxyphenyl)-1.3.5-triazines, for example 2,4,6-tris(2-hydroxy-4-octyloxyphenyl)-1,3,5-triazine, 2-(2-hydroxy-4-octyloxyphenyl)-4,6-bis-(2,4-dimethylphenyl)-1,3,5-triazine, 2-(2,4-dihydroxyphenyl)-4,6-bis(2,4-dimethylphenyl)-1,3,5-triazine, 2,4-bis(2-hydroxy-4-propyloxy-phenyl)-6-(2,4-dimethylphenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis(2,4-dimethylphenyl)-1,3,5-triazine, 2-[2-hydroxy-4-(2-hydroxy-3-butyloxy-propyloxy)phenyl]-4,6-bis(2,4-dimethylphenyl)-1,3,5-triazine, 2-[2-hydroxy-4-(2-hydroxy-3-octyloxy-propyloxy)phenyl]-4,6-bis(2,4-dimethylphenyl)-1,3,5-triazine, 2-[4-dodecyl/tridecyl-oxy-(2-hydroxypropyl)oxy-2-hydroxy-phenyl]-4,6-bis(2,4-dimethylphenyl)-1,3,5-triazine.

8. Phosphites and phosphonites, for example triphenyl phosphite, diphenyl alkyl phosphites, phenyl dialkyl phosphites, tris(nonylphenyl) phosphite, trilauryl phosphite, trioctadecyl phosphite, distearyl pentaerythrityl diphosphite, tris-(2,4-di-tert-butylphenyl) phosphite, diisodecyl pentaerythrityl diphosphite, bis-(2,4-di-tert-butylphenyl) pentaerythrityl diphosphite, bis-(2,6-di-tert-butyl-4-methylphenyl) pentaerythrityl diphosphite, bis-isodecyloxy pentaerythrityl diphosphite, bis-(2,4-di-tert-butyl-6-methylphenyl) pentaerythrityl diphosphite, bis-(2,4,6-tri-tert-butylphenyl) pentaerythrityl diphosphite, tristearyl sorbityl triphosphite, tetrakis-(2,4-di-tert-butylphenyl)-4,4'-biphenylene diphosphonite, 6-isooctyloxy-2,4,8,10-tetra-tert-butyl-12H-di-benzo[d,g]-1,3,2-dioxaphosphocine, 6-fluoro-2,4,8,10-tetra-tert-butyl-12-methyl-dibenzo[d,g]-1,3,2-dioxaphosphocine, bis-(2,4-di-tert-butyl-6-methylphenyl) methyl phosphite and bis(2,4-di-tert-butyl-6-methylphenyl) ethyl phosphite.

To accelerate the photopolymerization it is possible to add amines as component (d), for example triethanolamine, N-methyldiethanolamine, ethyl-p-dimethylaminobenzoate, 2-(dimethylamino)ethyl benzoate, 2-ethylhexyl-p-dimethylaminobenzoate, octyl-para-N,N-dimethylaminobenzoate, N-(2-hydroxyethyl)-N-methyl-para-toluidine or Michler's ketone. The action of the amines can be intensified by the addition of aromatic ketones of the benzophenone type. Examples of amines which can be used as oxygen scavengers are substituted N,N-dialkylanilines, as are described in EP 339841. Other accelerators, coinitiators and autoxidizers are thiols, thioethers, disulfides, phosphonium salts, phosphine oxides or phosphines, as described, for example, in EP 438123, in GB 2180358 and in JP Kokai Hei 6-68309.

It is further possible to add chain transfer agents which are customary in the art to the compositions according to the invention as component (d). Examples are mercaptans, amines and benzothiazol.

It is also possible to give a subject composition thermosetting property by adding compounds having epoxy groups as component (d). There may be used a solid or liquid known epoxy compound, and said epoxy compound is used depending on required characteristics. For example, when the plating resistance is to be improved, a liquid epoxy resin is used, and when water resistance is required, an epoxy resin having a large number of methyl groups on a benzene ring or a cycloalkyl ring is employed. A preferred epoxy resin, is a bisphenol S type epoxy resin such as BPS-200 produced by Nippon Kayaku Co., Ltd., EPX-30 produced by ACR Co., Epiculon EXA-1514 produced by Dainippon Ink & Chemicals Inc., etc.; a bisphenol A type epoxy resin such as Epiculon N-3050, N-7050, N-9050 produced by Dainippon Ink & Chemicals Inc., XAC-5005, GT-7004, 6484T, 6099 produced by Ciba Specialty Chemicals. Inc., etc.; a bisphenol F type epoxy resin such as YDF-2004, YDF2007 produced by Tohto Kasei Co., etc.; a diglycidyl phthalate resin such as Blemmer DGT produced by Nippon Oil and Fats Co., Ltd., etc.; a heterocyclic epoxy resin such as TEPIC produced by Nissan Chemical Industries, Ltd., Araldite PT810 produced by Ciba Specialty Chemicals Inc., etc.; a bixylenol type epoxy resin such as YX-4000 produced by Yuka Shell Co., etc.; a biphenol type epoxy resin such as YL-6056 produced by Yuka Shell Co., etc.; a tetraglycidyl xylenoylethane resin such as ZX-1063 produced by Tohto Kasei Co., etc.; a novolak type epoxy resin such as EPPN-201, EOCN-103, EOCN-1020, EOCN-1025 and BRRN produced by Nippon Kayaku Co., Ltd., ECN-278, ECN-292 and ECN-299 produced by Asahi Chemical Industry Co., Ltd., GY-1180, ECN-1273 and ECN-1299 produced by Ciba Specialty Chemicals Inc., YDCN-220L, YDCN-220HH, YDCN-702, YDCN-704, YDPN-601 and YDPN-602 produced by Tohto Kasei Co., Epiculon-673, N-680, N-695, N-770 and N-775 produced by Dainippon Ink & Chemicals Inc., etc.; a novolak type epoxy resin of bisphenol A such as EPX-8001, EPX-8002, EPPX-8060 and EPPX-8061 produced by Asahi Chemical Industry Co., Ltd., Epiculon N-880 produced by Dainippon Ink & Chemicals Inc., etc.; a chelate type epoxy resin such as EPX-49-69 and EPX-49-30 produced by Asahi Denka Kogyo K.K., etc.; a glyoxal type epoxy resin such as YDG-414 produced by Tohto Kasei Co., etc.; an amino group-containing epoxy resin such as YH-1402 and ST-110 produced by Tohto Kasei Co., YL-931 and YL-933 produced by Yuka Shell Co., etc.; a rubber-modified epoxy resin such as Epiculon TSR-601 produced by Dainippon Ink & Chemicals Inc., EPX-84-2 and EPX-4061 produced by Asahi Denka Kogyo K.K., etc.; a dicyclopentadiene phenolic type epoxy resin such as DCE-400 produced by Sanyo-Kokusaku Pulp Co., Ltd., etc.; a silicone-modified epoxy resin such as X-1359 produced by Asahi Denka Kogyo K.K., etc.; an □-caprolactone-modified epoxy resin such as Plaque G-402 and G-710 produced by Dicel Chemical Industries, Ltd., etc. and others. Further, partially esterified compounds of these epoxy compounds (e.g. esterified by (meth)acrylates) can be used in combination.

Further additives known in the art may be added as component (d), as for example flow improvers, adhesion promoters, such as vinyltrimethoxysilane, vinyltriethoxysilane vinyltris(2-methoxyethoxy)silane, N-(2-aminoethyl)-3-aminopropylmethyldimethoxysilane, N-(2-aminoethyl) 3aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane. Surfactants, optical brighteners, pigments, dyes, wetting agents, levelling assistants, dispersants, aggregation preventers, antioxidants or fillers are further examples for additives (d).

In order to cure thick and pigmented coatings it is appropriate to add glass microspheres or pulverized glass fibres, as described for example in U.S. Pat. No. 5,013,768.

The choice of additive(s) (d) is made depending on the field of application and on properties required for this field. The additives described above are customary in the art and accordingly are added in amounts which are usual in the respective application.

A polyester film or a polyethylene terephthalate film or other type of plastic film is generally used as the support for the photopolymerizable composition of the invention.

The resin composition on the support is dried by heating.

The dried resist may be laminated with a protective film of polyethylene or polypropylene if necessary.

The invention further relates to a dry film resist obtainable by the above process.

Further Embodiment

To increase the intensity of the developed image a 'latent acid' compound as disclosed in the PCT Publication WO02/101462, Application No. EP02/06105 or PCT Publication WO02/100914, application No. EP02/06109 can be added. Latent acids disclosed in the above PCT Publications are those of the formula

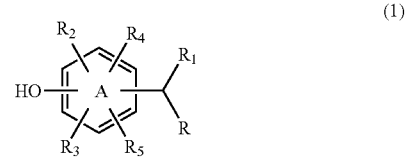

(1)

wherein the ring A can contain one or more hetero atoms and/or can contain an anelated ring, $R_1$ is hydrogen, alkyl, preferably $C_1$–$C_{20}$-alkyl, alkenyl, preferably $C_2$–$C_{20}$-alkenyl, aryl, preferably phenyl or phenyl which is substituted one to three times with $C_1$–$C_4$alkyl, or $C_1$–$C_4$alkoxy, $R_2$, $R_3$, $R_4$ and $R_5$ independently of each other are hydrogen or a functional substituent, and R stands for $C_1$–$C_6$alkyl, -$Z_1$-$Q_1$, or -$Z_2$$Q_2$, wherein $Z_1$ is a single bond, S, NH or O, and $Q_1$ is a heterocyclic ring system having from 5 to 9 ring atoms selected from C, S, O and N, with at least 2, preferably at least 3, more preferably at least 4 carbon atoms in the ring system, preferably $Q_1$ stands for morpholine, pyridine, which may be substituted one to three times with $C_1$–$C_4$alkyl or hydroxy, mercaptobenzoxazole, mercaptobenzthiazole, and wherein $Z_2$ stands for $C_1$–$C_4$alkylene, which can be substituted by $C_1$–$C_4$alkyl or $Q_3$, wherein $Q_3$ stands for phenyl which can be substituted one to three times with $C_1$–$C_4$alkyl, hydroxy, $C_5$–$C_8$cycloalkyl and/or a heterocyclic ring system having from 5 to 9 ring atoms selected from C, S, O and N, with at least 2, preferably at least 3, more preferably at least 4 carbon atoms in the ring system, and $Q_2$ stands for phenyl which can be substituted one to three times with $C_1$–$C_4$alkyl, hydroxy, $C_5$–$C_8$cycloalkyl and/or a heterocyclic ring system having from 5 to 9 ring atoms selected from C, S, O and N, with at least 2, preferably at least 3, more preferably at least 4 carbon atoms in the ring system, with the proviso that the hydrogen atom at the C-atom in a-position to R can be split off by irradiation.

Preferably, $Z_2$ stands for —$CH_2$—, —$CH_2$—$CH_2$—, —$CH_2$—$CHMe$—, —$CH_2$—$CHQ_3$-, in which $Q_3$ stands for 4-hydroxy-3-1-propyl-6-methylphenyl, 4-hydroxy-3-tert.-butyl-6-methylphenyl, or 4-hydroxy-3-cyclohexyl-6-methylphenyl and $Q_2$ stands for phenyl or 4-hydroxy-3-1-propyl-6-methylphenyl, 4-hydroxy-3-tert.-butyl-6-methylphenyl, or 4-hydroxy-3-cyclohexyl-6-methylphenyl.

Suitable rings A are e.g. phenyl, naphthyl, pyridyl and quinolinyl, phenyl and pyridyl are especially preferred.

$R_1$ is preferably hydrogen, or methyl.

Functional substituents $R_2$, $R_3$, $R_4$ and $R_5$ are e.g. $C_1$–$C_2$α-alkyl, preferably $C_1$–$C_8$-alkyl, particularly preferred $C_1$–$C_6$-alkyl, especially preferred $C_1$–$C_4$-alkyl, $C_5$–$C_8$-Cycloalkyl, $C_2$–$C_{20}$-alkenyl, preferred $C_2$–$C_6$-alkenyl, $C_1$–$C_6$-alkoxy, hydroxy, halogen, nitro, cyano, —$SO_2R'$, wherein R' is hydrogen, alkyl or a metallic cation such as a alkali metal, e.g. sodium or potassium, or earth alkali metal cation, e.g. calcium, or phenyl, which may be substituted one to three times with hydroxy and/or $Z_{21}$-$R_7$, wherein $Z_{21}$ stands for $C_1$–$C_4$alkylene, which can be substituted by $C_1$–$C_4$alkyl, and $R_7$ stands for hydrogen, $C_1$–$C_4$alkyl or phenyl, which may be substituted one to three times with hydroxy, $C_1$–$C_4$alkyl and/or $Z_{22}$-$R_8$, wherein $Z_{22}$ stands for for $C_1$–$C_4$alkylene, which can be substituted by $C_1$–$C_4$alkyl, and $R_8$ stands for a heterocyclic ring system having from 5 to 9 ring atoms selected from C, S, O and N, with at least 2, preferably at least 3, more preferably at least 4 carbon atoms in the ring system, preferably $R_8$ stands for morpholine. In a preferred embodiment of this invention $R_2$, $R_3$, $R_4$ and $R_5$ are preferably independently of each other hydrogen, $C_1$–$C_{20}$-alkyl or $C_2$–$C_{20}$-alkenyl or substituted phenyl wherein hydroxy and $Z_{21}$-$R_7$ being the substituents. Especially preferred compounds of formula (1) are those wherein $R_2$ and $R_3$ are independently of each other $C_1$–$C_8$-alkyl and $R_4$ and $R_5$ are each hydrogen.

Especially suitable latent acids are:

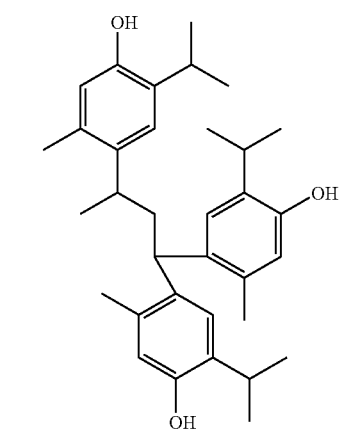
(2)

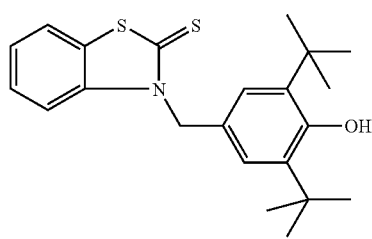
(3)

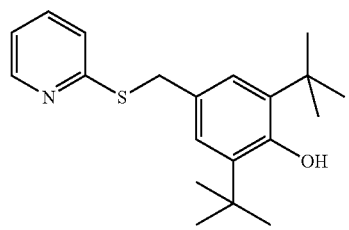
(4)

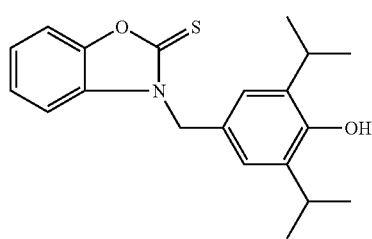
(5)

-continued

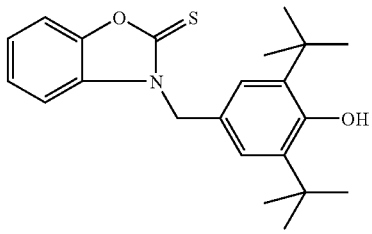
(6)

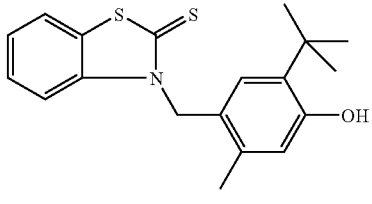
(7)

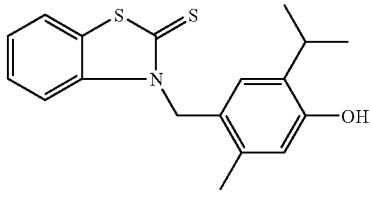
(8)

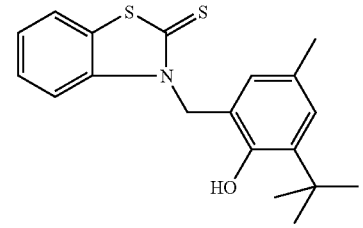
(9)

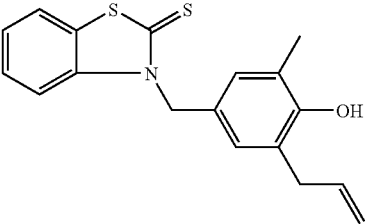
(10)

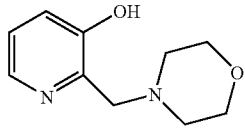
(11)

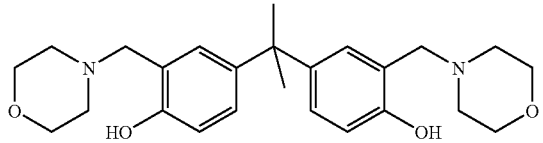
(12)

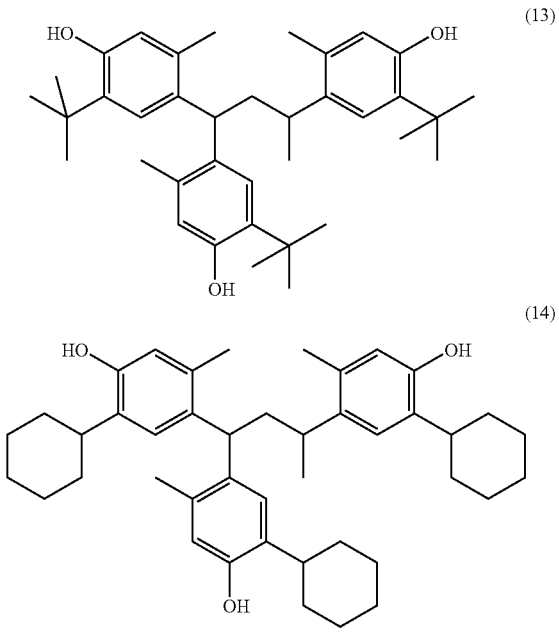

Compound (13) is commercially available from Aldrich CAS number [1843-03-4] 1,1,3-Tris(2-methyl-4-hydroxy-5-tert.butylphenyl)butane.

Another suitable latent acid is a phenolic antioxidant such as pentaerythritol tetrakis (3-(3,5-di-tert-butyl-4-hydroxyphenyl) propionate) (available as Irganoxe® 1010, Ciba Specialty Chemicals).

Colour formers can be formulated with these latent acids in plastics via melt processing to produce an essentially colourless heat stable substrate that can be selectively imaged by exposure to UV light of a certain wavelength and intensity. The latent acids are normally used in a ratio of 0.1–10 parts per 1 part colour former.

Preferred is a 1:1 mixture of compound (13) with Pergascript Blue SRB.

Preparation:

a) Preparation of the Dye.

The dye according to point (e) is commercially available, for example Pergascript Blue S-RBP from Ciba Specialty Chemicals or can be prepared according to methods known in the art such as those disclosed in U.S. Pat. No. 4,154,463 manufacturing direction J.

b) Preparation of the Photocurable Resin Composition.

The method for preparing the photocurable resin composition of the present invention is not limited to any special method, and can be prepared by a conventional mechanical mixing process.

The compositions may be used as a solution prepared by dissolving the ingredients (a) to (e) in an appropriate solvent. Such solvents include solvents for use in conventional resist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers, and other polyhydric alcohols and derivatives thereof; dioxane, and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination.

c) Preparation of a Resist Element and Way to Use a Dry Film Resist.

The process for preparing a dry film resist element comprises the steps of (A) forming a photocurable resin composition layer made of ingredients(a)–(e) as defined above onto a support film with a thickness of 1 to 50 μm, and laminate a protective film onto the photocurable composition layer to obtain a dry film resist;

(B) removing the protective film before use, and thermally laminate the photocurable composition layer onto the surface of a desired substrate for the application of the dry film resist at 100–150° C.;

(C) exposure to radiation through a mask or by direct laser irradiation;

(D) removing the support film and wash away the unexposed (uncured) area by development.

Radiation sources which can be used are in principle all lamps which emit radiation in the UV and/or VIS region. Both point light sources and spread emitters (lamp carpets) are suitable. Examples are: carbon arc lamps, xenon arc lamps, mercury vapour lamps, if desired doped with metal halides (metal halide lamps), fluorescent lamps, argon incandescent lamps, electronic flash lamps, photographic flood lamps, electron beams and X-rays. Laser lights can also be used as a source, for example argon ion lasers, krypton ion lasers, argon ion UV laser (DP-100 from Orbotech) solid state UV laser (Gemini from ManiaBarco, DI-2050 from PENTAX) and violet laser (405 nm; DI-2080 and DI-PDP from PENTAX). Laser light also allows the resist to be exposed without a mask by writing the controlled laser beam directly on the resist layer.

Use

Application areas of the dry film resist element using the photosensitive composition described in the present invention are for forming copper circuit pattern of printed circuit board and LSI packaging like etching resist and plating resist, for solder resist and for forming cell or electrode pattern in various flat display panel applications, e.g. forming barrier lib used in a plasma display panel by sand blast method.

EXAMPLES

Example 1

Sample Preparation

A photocurable resist formulation for a dry film resist is prepared by mixing 100 parts by weight of ACA200M [solid content is 50% in weight] (Daicel Chemical Industries, Ltd.), 20 parts by weight of dipentaerythritol hexaacrylate (Aldrich), 3.5 parts by weight of (4-morpholinobenzoyl)-1-benzyl-1-dimethylaminopropane (IRGACURE369 from Ciba Specialty Chemicals) and 50 parts by weight of acetone. To that mixture 0.6 parts by weight of 4,4'-[(9-Butyl-9H-carbazol-3-yl)methylene]bis[N-methyl-N-phenylaniline] (Pergascript Blue S-RBP from Ciba Specialty Chemicals) is added and stirred. All operations are carried out under yellow light. The formulations are applied to PET film. The solvent is removed by heating at 80° C. for 10 minutes in a convection oven. The thickness of the dried resist layer is 33 μm.

Evaluation

The color generation of the resist are monitored by the visible absorption at 620 nm by using spectrophotometer U-3300 (Hitachi). After the measuring absorbance, the resist surface is laminated with PET and heated at 130° C. for 15 minutes to mimic the heat lamination step of a dry film resist process. Then the absorbance is measured after removing the PET film from the one side of the resist. The resist is exposed at 300 mJ/cm$^2$ by using a metal halide lamp (ORC, model SMX 3000), and the absorbance is measured.

Comparative Example

Sample preparation and evaluation are done in the same way as Example except 4,4'-[(9-Butyl-9H-carbazol-3-yl) methylene]bis[N-methyl-N-phenylaniline] is replaced with 0.3 parts by weight of Leuco Crystal Violet (Aldrich).

The results are shown in Table 1.

| Example | Treatment | Absorbance at 620 nm |
| --- | --- | --- |
| Example 1 | before treatment | 0 |
|  | 15 min. 130° C. | 0.005 |
|  | 15 min. 130° C. + 300 mJ/sqcm | 0.065 |
| Comparative Ex. | before treatment | 0 |
|  | 15 min. 130° C. | 0.03 |
|  | 15 min. 130° C. + 300 mJ/sqcm | 0.062 |

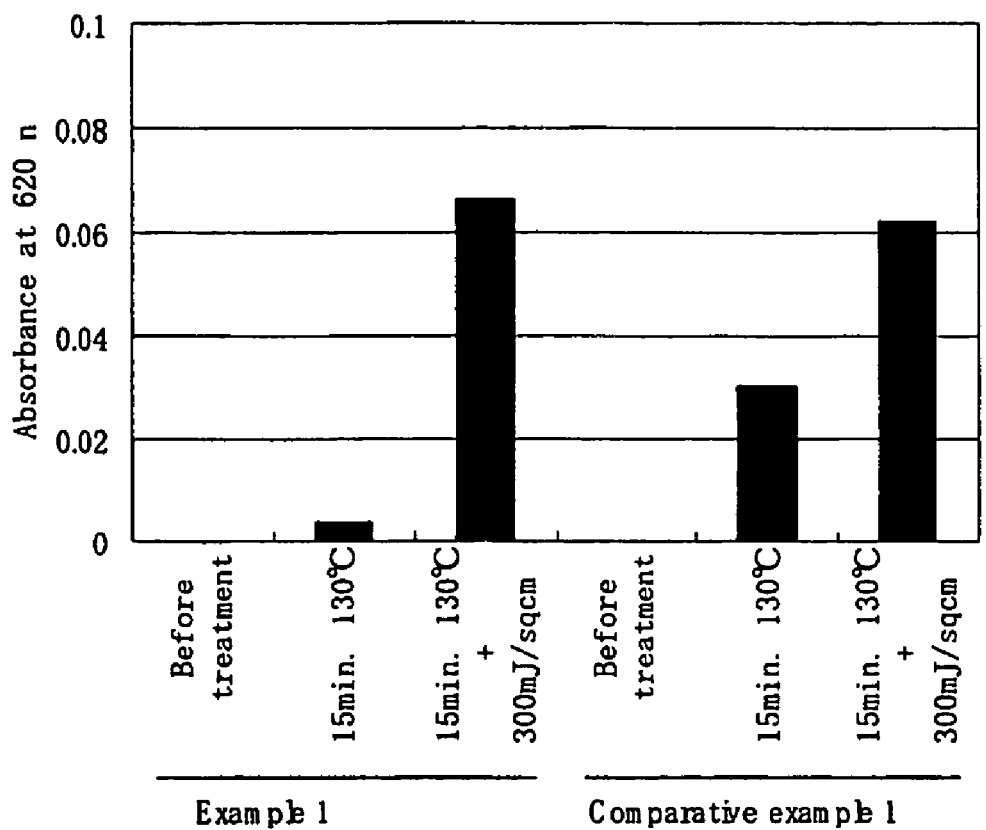

The Examples clearly show that using a leuco dye described by the general formula I, unfavourable colour generation during the heat lamination process is reduced and enough color generation can be achieved after UV exposure. Thus clear color contrast between exposed and unexposed area is obtained.

Example 2

Sample Preparation

A photocurable resist formulation for a dry film resist is prepared by mixing 50 parts by weight of esterified styrene maleic-anhydride copolymer (Scripset 540 from Hercules), 50 parts by weight of trimethylolpropane triacrylate (TCI), 5.0 parts by weight of 2,2-dimethoxy-2-phenyl acetophenone (IRGACURE651 from Ciba Specialty Chemicals), 130 parts by weight of acetone and 20 parts by weight of methanol. To that mixture 0.5 parts by weight of 4,4'-[(9-Butyl-9H-carbazol-3-yl)methylene]bis[N-methyl-N-phenylaniline] (Pergascript Blue S-RBP from Ciba Specialty Chemicals) is added and stirred. All operations are carried out under yellow light. The formulations are applied to PET film. The solvent is removed by heating at 60° C. for 10 minutes in a convection oven. The thickness of the dried resist layer is 38 μm.

Evaluation

The color generation of the resist is monitored by the visible absorption at 620 nm by using spectrophotometer U-3300 (Hitachi). The absorption is measured before and after the heat treatment at 100° C. for 5 minutes to mimic the heat lamination step of a dry film resist process. Then the resist is exposed at 50 mJ/cm$^2$ by using a metal halide lamp (ORC, model SMX 3000), and the absorbance is measured.

Comparative Example 2

Sample preparation and evaluation are done in the same way as Example 2 except 4,4'-[(9-Butyl-9H-carbazol-3-yl)methylene]bis[N-methyl-N-phenylaniline] is replaced with 0.5 parts by weight of Leuco Crystal Violet (Aldrich).

The results are shown in Table 2.

| Example | Treatment | Absorbance at 620 nm |
| --- | --- | --- |
| Example 2 | before treatment | 0.020 |
| | 5 min. 100° C. | 0.042 |
| | 5 min. 100° C. + 50 mJ/sqcm | 0.155 |
| Comparative Ex. 2 | before treatment | 0.034 |
| | 5 min. 100° C. | 0.137 |
| | 5 min. 100° C. + 50 mJ/sqcm | 0.176 |

Example 3-1

Sample Preparation

A photocurable resist formulation for a dry film resist is prepared by mixing 70 parts by weight of esterified styrene maleic-anhydride copolymer (Scripset 540 from Hercules), 30 parts by weight of trimethylolpropane triacrylate (TCI), 5.0 parts by weight of (4-morpholinobenzoyl)-1-benzyl-1-dimethylaminopropane (IRGACURE369 from Ciba Specialty Chemicals), 130 parts by weight of acetone and 20 parts by weight of methanol. To that mixture 1.0 parts by weight of 4,4'-[(9-Butyl-9H-carbazol-3-yl)methylene]bis[N-methyl-N-phenylaniline] (Pergascript Blue S-RBP from Ciba Specialty Chemicals) is added and stirred (s-1). All operations are carried out under yellow light. The formulations are applied to PET film. The solvent is removed by heating at 60° C. for 10 minutes in a convection oven. The thickness of the dried resist layer is 38 μm.

Evaluation

The color generation of the resist are monitored by the visible absorption at 620 nm by using spectrophotometer U-3300 (Hitachi). The absorption is measured before and after the heat treatment at 100° C. for 5 minutes to mimic the heat lamination step of a dry film resist process. Then the resist is exposed at 400 mJ/cm$^2$ by using a metal halide lamp (ORC, model SMX 3000), and the absorbance is measured.

Example 3-2

Sample preparation and evaluation are done in the same way as Example 3-1 except 2.0 parts of Irgacure 250 (iodonium, (4-methylphenyl)[4-(2-methylpropyl)phenyl]-, hexafluorophosphate(1-) by Ciba Specialty Chemicals) is added to the resist solution (s-1).

Comparative Example 3

Sample preparation and evaluation are done in the same way as Example 3-1 except 4,4'-[(9-Butyl-9H-carbazol-3-yl)methylene]bis[N-methyl-N-phenylaniline] is replaced with 0.5 parts by weight of Leuco Crystal Violet (Aldrich).

The results are shown in Table 3.

TABLE 3

| Example | Treatment | Absorbance at 620 nm |
| --- | --- | --- |
| Example 3-1 | before treatment | 0.012 |
| | 5 min. 100° C. | 0.032 |
| | 5 min. 100° C. + 400 mJ/sqcm | 0.077 |
| Example 3-2 | before treatment | 0.012 |
| | 5 min. 100° C. | 0.029 |
| | 5 min. 100° C. + 400 mJ/sqcm | 0.109 |
| Comparative Ex. 3 | before treatment | 0.018 |
| | 5 min. 100° C. | 0.061 |
| | 5 min. 100° C. + 400 mJ/sqcm | 0.106 |

The Examples clearly show that using a leuco dye described by the general formula I, unfavorable color generation during the heat lamination process is reduced and enough color generation can be achieved after UV exposure. By adding iodonium photo acid generator, Irgacure 250, into the formulation the color generation of a leuco dye described by the general formula I is promoted with retaining the low level of color generation during the heat lamination process. Thus clear color contrast between exposed and unexposed area is obtained.

What is claimed is:

1. A process for preparing a dry film resist, which process comprises forming a photocurable resin composition onto a support film with a thickness of 1 to 50 μm and optionally laminate a protective film onto the photocurable composition layer to obtain a dry film resist; whereby the photocurable resin is formed from a homogeneous mixture comprising (a) from 20–90 wt % of an alkaline soluble acrylic polymer having carboxylic acid function as a pendant group and having a molecular weight of about 2,000 to 2,000,000, and an acid value from 50 to 600 mg KOH/g;
(b) from 5 to 60 wt % of one or more photopolymerizable monomers which are compatible with the oligomers and polymers of component (a);
(c) from 0.01 to 20% by weight of one or more photoinitiators;
(d) from 0 to 20% by weight of additives and/or assistants; and
(e) from 0.1 to 10% by weight of a leuco triphenylmethane dye of the formula I

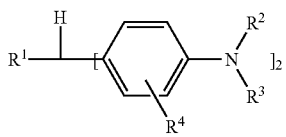

wherein
$R^1$ is a residue selected from

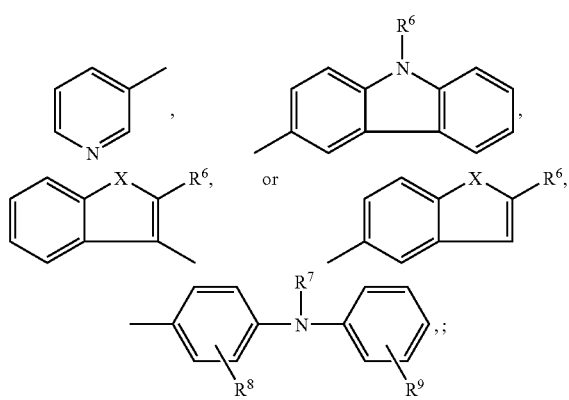

$R^2$ is $C_1$–$C_{12}$ alkyl or phenyl which may be mono-, di- or tri-substituted by $C_1$–$C_6$ alkyl, trifluoromethyl, $C_{1-6}$ alkoxy, $C_{1-6}$ alkylthio, halogen and nitro;
$R^3$ is hydrogen or $C_1$–$C_{12}$ alkyl;
$R^4$ to $R^9$ independently of one another are hydrogen or $C_1$–$C_{12}$ alkyl; and
X is O, S, NH or N—$C_1$–$C_{12}$-alkyl;
where the total of (a) through (e) equals 100% by weight.

2. A process according to claim 1, wherein in formula I $R^1$ is a residue

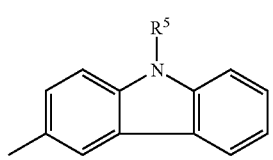

-continued
or

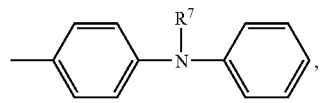

$R^2$ is unsubstituted phenyl,
$R^3$ is $C_1$–$C_4$alkyl
$R^4$ is hydrogen; and
$R^5$ and $R^7$ are $C_1$–$C_4$alkyl.

3. A process according to claim 1, wherein the leuco triphenylmethan dye is 4,4'-[(9-Butyl-9H-carbazol-3-yl)methylene]bis[N-methyl-N-phenylaniline of the formula

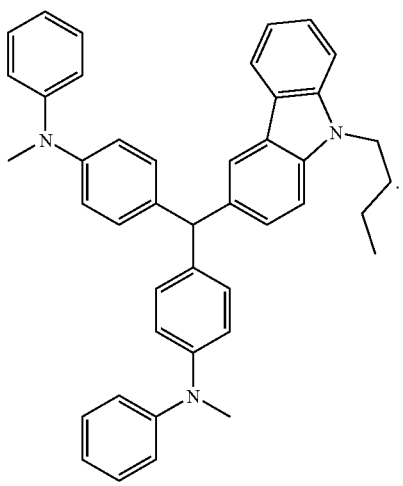

4. A process according to claim 1, wherein component d) includes a diaryliodonium of formula.

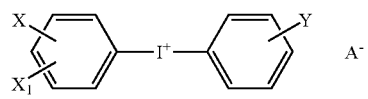

wherein
X is branched $C_3$–$C_{20}$alkyl or $C_3$–$C_8$cycloalkyl;
$X_1$ is hydrogen, linear $C_1$–$C_{20}$alkyl, branched $C_3$–$C_{20}$alkyl or $C_3$–$C_8$cycloalkyl; with the proviso that the sum of the carbon atoms in X and $X_1$ is at least 4;
Y is linear $C_1$–$C_{10}$alkyl, branched $C_3$–$C_{10}$alkyl or $C_3$–$C_8$cycloalkyl;
$A^-$ is a non-nucleophilic anion, selected from the group consisting of $(BF_4)^-$, $(SbF_6)^-$, $(PF_6)^-$, $(B(C_6F_5))_4^-$, $C_1$–$C_{20}$alkylsulfonate, $C_2$–$C_{20}$haloalkylsulfonate, unsubstituted $C_6$–$C_{10}$arylsulfonate, camphor-sulfonate, $C_1$–$C_{20}$-perfluoroalkylsulfonylmethide, $C_1$–$C_{20}$-perfluoroalkylsulfonylimide, and $C_6$–$C_{10}$arylsulfonate substituted by halogen, $NO_2$, $C_1$–$C_{12}$alkyl, $C_1$–$C_{12}$halo-alkyl, $C_1$–$C_{12}$alkoxy or by $COOR_1$; and R₁ is $C_1$–$C_{20}$alkyl, phenyl, benzyl; or phenyl mono- or poly-substituted by $C_1$–$C_{12}$alkyl, $C_1$–$C_{12}$alkoxy or by halogen.

5. A dry film resist obtained by a process according to claim 1.

6. A process for preparing a dry film resist element comprising the steps of (A) forming a photocurable resin composition layer made of ingredients (a)–(e) according to claim 1 onto a support film with a thickness of 1 to 50 μm, and laminate a protective film onto the photocurable composition layer to obtain a dry film resist;

(B) removing the protective film before use, and thermally laminate the photocurable composition layer onto the surface of a desired substrate for the application of the dry film resist at 100–150° C.;

(C) exposure to radiation through a mask or by direct laser irradiation; and (D) removing the support film and wash away the unexposed (uncured) area by development.

7. A dry film resist element obtained by a process according to claim 6.

8. A process according to claim 6 wherein component (e) is 4,4'-[(9-butyl-9H-carbazol-3-yl)methylene]bis[N-methyl-N-phenylaniline of the formula

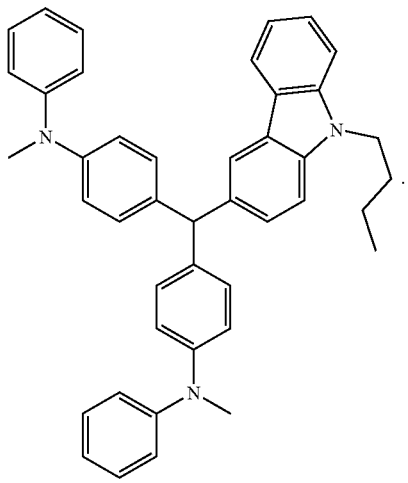

9. A process according to claim 6 for forming copper circuit pattern of printed circuit boards, LSI packaging etching resist or plating resist, for solder resist or for forming cell or electrode pattern in flat display panel applications.

* * * * *